(12) United States Patent
Butler et al.

(10) Patent No.: US 11,217,909 B2
(45) Date of Patent: Jan. 4, 2022

(54) CONNECTOR SUITABLE FOR HARSH ENVIRONMENTS

(71) Applicant: Teledyne Instruments, Inc., Thousand Oaks, CA (US)

(72) Inventors: Matthew Butler, Rochester, NH (US); Steve Volk, York, ME (US)

(73) Assignee: Teledyne Instruments, Inc., Thousand Oaks, CA (US)

( * ) Notice: Subject to any disclaimer, the term of this patent is extended or adjusted under 35 U.S.C. 154(b) by 119 days.

(21) Appl. No.: 16/571,727

(22) Filed: Sep. 16, 2019

(65) Prior Publication Data

US 2021/0083405 A1  Mar. 18, 2021

(51) Int. Cl.
| | |
|---|---|
| H01R 13/24 | (2006.01) |
| H01R 13/52 | (2006.01) |
| H01R 13/40 | (2006.01) |
| H01R 13/625 | (2006.01) |
| H01R 4/48 | (2006.01) |
| H01R 4/30 | (2006.01) |

(52) U.S. Cl.
CPC .............. H01R 4/48 (2013.01); H01R 4/30 (2013.01)

(58) Field of Classification Search
CPC ........... H01R 4/30; H01R 4/48; H01R 13/523
USPC ................. 439/700, 271, 586, 345
See application file for complete search history.

(56) References Cited

U.S. PATENT DOCUMENTS

| | | | |
|---|---|---|---|
| 3,982,804 A | 9/1976 | Marechal | |
| 4,203,640 A | 5/1980 | Bice et al. | |
| 4,339,165 A | 7/1982 | Malsot et al. | |
| 4,606,603 A | 8/1986 | Cairns | |
| 4,616,900 A | 10/1986 | Cairns | |
| 4,653,835 A | 3/1987 | Schulte et al. | |
| 4,666,242 A | 5/1987 | Cairns | |
| 4,673,242 A | 6/1987 | Logan et al. | |
| 4,682,848 A | 7/1987 | Cairns et al. | |
| 4,753,611 A | 6/1988 | Kobler | |
| 4,773,725 A | 9/1988 | Ashman et al. | |

(Continued)

FOREIGN PATENT DOCUMENTS

| | | |
|---|---|---|
| CH | 680312 A5 | 7/1992 |
| DE | 615452 C | 7/1935 |

(Continued)

OTHER PUBLICATIONS

Partial European Search Report and Provisional Opinion Accompanying Partial Search Result for European Application No. 20195813 completed Nov. 13, 2020.

(Continued)

*Primary Examiner* — Abdullah A Riyami
*Assistant Examiner* — Thang H Nguyen
(74) *Attorney, Agent, or Firm* — K&L Gates LLP

(57) ABSTRACT

A connector comprising a contact, a plunger, and a spring activated seal is provided. The contact is positioned within the housing and configured to transmit at least one of an electrical signal and an optical signal between the connector and a secondary device. The plunger is positioned within the housing and in communication with the contact. The spring activated seal comprises a flexible portion and a spring configured to urge the flexible portion to contact the housing and at least one of the plunger and a contact of the secondary device to form a fluid tight seal therebetween.

8 Claims, 7 Drawing Sheets

(56) References Cited

U.S. PATENT DOCUMENTS

| | | | | |
|---|---|---|---|---|
| 4,795,359 | A | 1/1989 | Alcock et al. | |
| 4,865,563 | A | 9/1989 | Ney et al. | |
| 4,878,731 | A | 11/1989 | Caron et al. | |
| 4,929,184 | A | 5/1990 | Emadi et al. | |
| 4,948,377 | A | 8/1990 | Cairns | |
| 5,171,158 | A | 12/1992 | Cairns | |
| 5,194,012 | A | 3/1993 | Cairns | |
| 5,217,391 | A | 6/1993 | Fisher, Jr. | |
| 5,234,350 | A | 8/1993 | Marechal et al. | |
| 5,645,438 | A * | 7/1997 | Cairns | G02B 6/3816 439/139 |
| 5,685,727 | A | 11/1997 | Cairns | |
| 5,738,535 | A * | 4/1998 | Cairns | G02B 6/3816 439/138 |
| 5,899,765 | A | 5/1999 | Niekrasz et al. | |
| 6,017,227 | A * | 1/2000 | Cairns | G02B 6/3816 439/138 |
| 6,315,461 | B1 * | 11/2001 | Cairns | G02B 6/3816 385/56 |
| 6,332,787 | B1 | 12/2001 | Barlow et al. | |
| 6,511,335 | B1 * | 1/2003 | Rayssiguier | H01R 13/523 439/191 |
| 6,736,545 | B2 | 5/2004 | Cairns et al. | |
| 7,004,638 | B2 * | 2/2006 | Nicholson | G02B 6/3816 385/53 |
| 7,056,179 | B2 | 6/2006 | Courtney | |
| 8,192,089 | B2 | 6/2012 | Cairns et al. | |
| 8,226,303 | B2 | 7/2012 | Toth | |
| 8,971,152 | B2 | 3/2015 | Chelminski | |
| 9,077,099 | B1 * | 7/2015 | Hatcher | G02B 6/3816 |
| 9,097,861 | B2 | 8/2015 | Hatcher et al. | |
| 9,246,261 | B2 | 1/2016 | Hatcher et al. | |
| 9,556,686 | B1 * | 1/2017 | Krumpe | G02B 6/3816 |
| 9,690,052 | B2 | 6/2017 | Toth | |
| 10,693,251 | B2 * | 6/2020 | Ross | H01R 25/162 |
| 2002/0140184 | A1 | 10/2002 | Janoff et al. | |
| 2006/0160430 | A1 * | 7/2006 | Siddiqi | H01R 13/523 439/700 |
| 2008/0205831 | A1 * | 8/2008 | Prel | G02B 6/3816 385/111 |
| 2009/0053931 | A1 | 2/2009 | Islam | |
| 2010/0244431 | A1 * | 9/2010 | Smith, III | F16L 37/32 285/10 |
| 2010/0323540 | A1 * | 12/2010 | Zacharevitz | H01R 24/66 439/95 |
| 2011/0304135 | A1 * | 12/2011 | Chaize | E21B 33/0385 285/305 |
| 2015/0036986 | A1 | 2/2015 | Kretschmar et al. | |
| 2015/0104964 | A1 * | 4/2015 | McIntosh | H01R 13/523 439/271 |
| 2016/0006161 | A1 * | 1/2016 | Ranalli | G02B 6/3816 439/199 |
| 2016/0072219 | A1 * | 3/2016 | Christiansen | H01R 13/523 439/271 |
| 2016/0172781 | A1 * | 6/2016 | Nunner | H01R 4/38 439/660 |
| 2017/0204680 | A1 * | 7/2017 | Leismer | E21B 43/128 |
| 2020/0080388 | A1 * | 3/2020 | Leismer | E21B 47/008 |

FOREIGN PATENT DOCUMENTS

| | | |
|---|---|---|
| EP | 0141746 A2 | 5/1985 |
| EP | 0538089 A1 | 4/1993 |
| EP | 3123224 B1 | 5/2018 |
| GB | 2166261 A | 4/1986 |
| JP | 2000-505232 A | 4/2000 |
| JP | 2002-508535 A | 3/2002 |
| JP | 2004-246096 A | 9/2004 |
| JP | 6464185 B2 | 2/2019 |
| SU | 1356080 A1 | 11/1987 |
| WO | WO 96/22554 A2 | 7/1996 |
| WO | WO 97/33348 A1 | 9/1997 |

OTHER PUBLICATIONS

Extended European Search Report for European Application No. 20195813 dated Feb. 24, 2021.

Extended European Search Report for European Application No. 21198683.1 dated Nov. 22, 2021.

* cited by examiner

CONNECTOR SUITABLE FOR HARSH ENVIRONMENTS

FIELD OF USE

The present disclosure relates to connectors configured for use in harsh environments.

BACKGROUND

Various types of connectors are known for providing electrical and/or optical connections in harsh environments. Examples include connectors for providing subsea electrical and/or optical connections in an oil and/or gas well environment. In the harsh environments, the connectors may be exposed to seawater and may experience pressures greater than 10,000 pounds per square inch (PSI). There are challenges with operating connectors in harsh environments.

SUMMARY

In one aspect, a connector comprising a contact, a plunger, and a spring activated seal is provided. The contact is positioned within the housing and configured to transmit at least one of an electrical signal and an optical signal between the connector and a secondary device. The plunger is positioned within the housing and in communication with the contact. The spring activated seal comprises a flexible portion and a spring configured to urge the flexible portion to contact the housing and at least one of the plunger and a contact of the secondary device to form a fluid tight seal therebetween.

In another aspect, a connector comprising a housing, a contact, and a dual-lipped spring activated seal is provided. The contact is positioned within the housing and configured to transmit at least one of an electrical signal and an optical signal between the connector and a secondary device. The dual-lipped spring activated seal comprises a flexible portion, a first spring, and a second spring. The flexible portion comprises a first concave portion and a second concave portion. The first spring is configured to urge the first concave portion to contact the housing and the secondary device to form a first fluid tight seal therebetween. The second spring is configured to urge the second concave portion to contact the housing and the secondary device to form a second fluid tight seal therebetween.

It will be understood that the invention disclosed and described in this specification is not limited to the aspects summarized in this Summary. The reader will appreciate the foregoing details, as well as others, upon considering the following detailed description of various non-limiting and non-exhaustive aspects according to this specification.

BRIEF DESCRIPTION OF THE DRAWINGS

The features and advantages of the examples, and the manner of attaining them, will become more apparent, and the examples will be better understood, by reference to the following description taken in conjunction with the accompanying drawings, wherein.

Corresponding reference characters indicate corresponding parts throughout the several views. The exemplifications set out herein illustrate certain embodiments, in one form, and such exemplifications are not to be construed as limiting the scope of the appended claims in any manner.

DETAILED DESCRIPTION OF NON-LIMITING EMBODIMENTS

Figure 1:
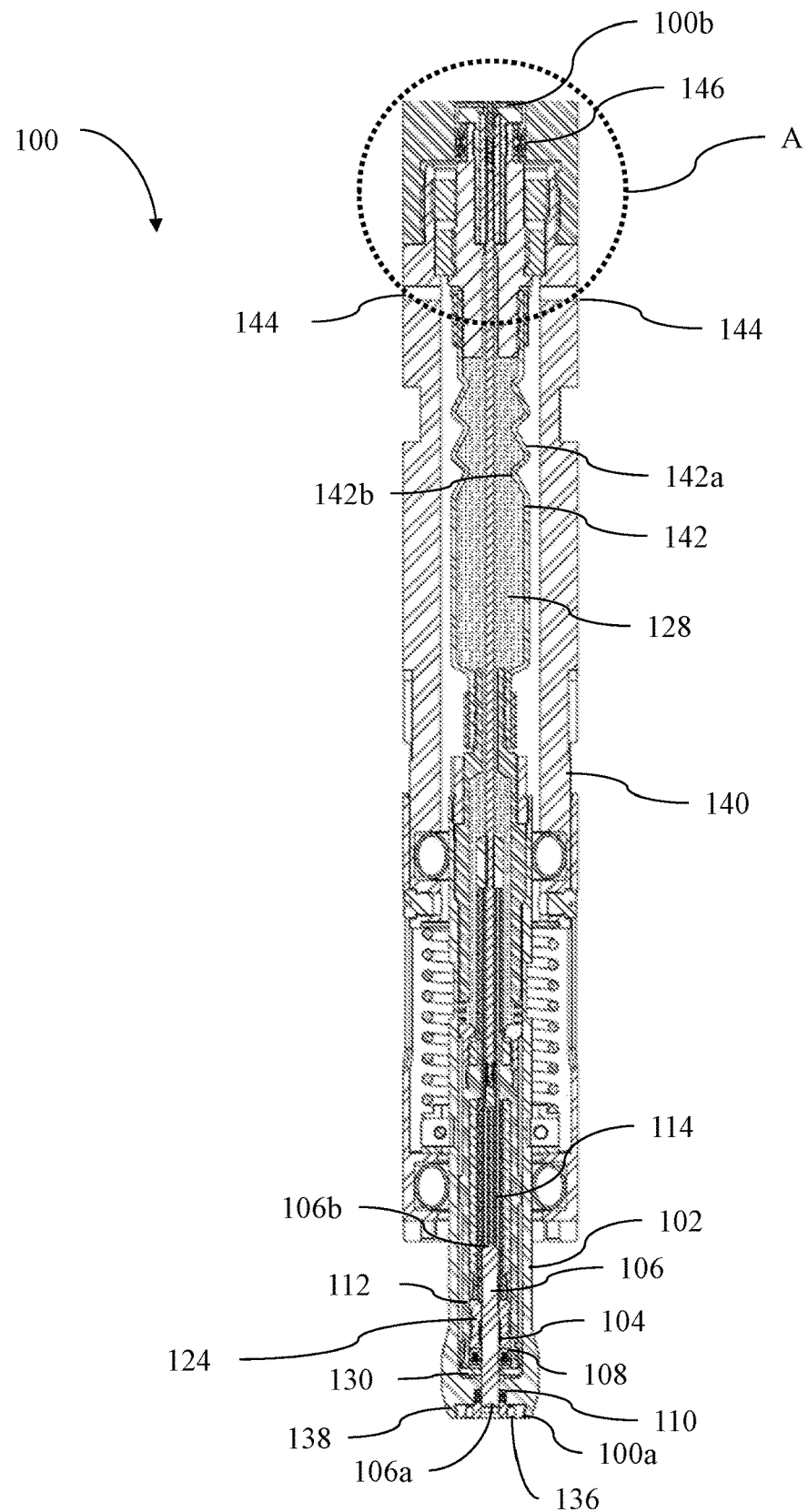
FIG. 1 is a front cross-sectional view of a portion of a non-limiting embodiment of a connector according to the present disclosure.

Various embodiments are described and illustrated herein to provide an overall understanding of the structure, function, and use of the disclosed apparatus. The various embodiments described and illustrated herein are non-limiting and non-exhaustive. Thus, an invention is not limited by the description of the various non-limiting and non-exhaustive embodiments disclosed herein. Rather, the invention is defined solely by the claims. The features and characteristics illustrated and/or described in connection with various embodiments may be combined with the features and characteristics of other embodiments. Such modifications and variations are intended to be included within the scope of this specification. As such, the claims may be amended to recite any features or characteristics expressly or inherently described in, or otherwise expressly or inherently supported by, this specification. Further, Applicant reserves the right to amend the claims to affirmatively disclaim features or characteristics that may be present in the prior art. The various embodiments disclosed and described in this specification can comprise, consist of, or consist essentially of the features and characteristics as variously described herein.

Any references herein to "various embodiments," "some embodiments," "one embodiment," "an embodiment," or like phrases mean that a particular feature, structure, or characteristic described in connection with the example is included in at least one embodiment. Thus, appearances of the phrases "in various embodiments," "in some embodiments," "in one embodiment," "in an embodiment," or like phrases in the specification do not necessarily refer to the same embodiment. Furthermore, the particular described features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation. Such modifications and variations are intended to be included within the scope of the present embodiments.

In this specification, unless otherwise indicated, all numerical parameters are to be understood as being prefaced and modified in all instances by the term "about," in which the numerical parameters possess the inherent variability characteristic of the underlying measurement techniques used to determine the numerical value of the parameter. At the very least, and not as an attempt to limit the application of the doctrine of equivalents to the scope of the claims, each numerical parameter described herein should at least be construed in light of the number of reported significant digits and by applying ordinary rounding techniques.

Also, any numerical range recited herein includes all sub-ranges subsumed within the recited range. For example, a range of "1 to 10" includes all sub-ranges between (and including) the recited minimum value of 1 and the recited maximum value of 10, that is, having a minimum value equal to or greater than 1 and a maximum value equal to or less than 10. Any maximum numerical limitation recited in this specification is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited. All such ranges are inherently described in this specification.

The grammatical articles "a," "an," and "the," as used herein, are intended to include "at least one" or "one or more," unless otherwise indicated, even if "at least one" or "one or more" is expressly used in certain instances. Thus, the foregoing grammatical articles are used herein to refer to one or more than one (i.e., to "at least one") of the particular identified elements. Further, the use of a singular noun includes the plural, and the use of a plural noun includes the singular, unless the context of the usage requires otherwise.

As used herein, "intermediate" means that the referenced element is disposed between two elements but is not necessarily in contact with those elements. Accordingly, unless stated otherwise herein, an element that is "intermediate" a first element and a second element may or may not be adjacent to or in contact with the first and/or second elements, and other elements may be disposed between the intermediate element and the first and/or second elements.

As used herein, the term "subsea" means an environment under the surface of a body of water, such as, for example, the surface of an ocean, the surface of a lake, or the surface of a river. For example, a subsea environment can be at least 1 foot below a surface of a body of water, such as, for example, at least 10 feet below the surface, at least 100 feet below the surface, at least 1,000 feet below the surface, or at least 10,000 feet below the surface of a body of water.

As used herein, "wet-mateable" as applied to a connector means that the connector portions (e.g., pin and receptacle) can be mated (e.g., connected together) underwater.

Downhole electrical and/or optical connectors (e.g., a plug and a receptacle of wet-mateable connectors) can be used in harsh environments, such as, for example, subsea oil and gas well environments. A first connector can be connected to downhole equipment (e.g., pumps, sensors), while a second connector can be at the end of a power supply cable or signal communication cable, such as, for example, a tubing hanger. The first and second connectors can be mated and unmated at a location downhole and/or subsea in order to reliably connect electrical and/or optical signals to downhole equipment. In these applications, the connectors may be exposed to fluids, such as, for example, seawater, completion fluids, brines, petroleum fluids, which can corrode a portion of the connector and/or interfere with the electrical and/or optical signal. Thus, it can be desirable to inhibit fluids from entering the connectors and/or the connection between connectors, and/or ensure optimal transmission of the electrical and/or optical signal between the connectors.

Additionally, in subsea applications, the connectors may experience high pressures such as, for example, pressures greater than 10,000 PSI (69 Megapascals (MPa)). The high pressure can urge the fluids to enter conventional connectors and corrode or otherwise interfere with the electrical and/or optical signal. For example, a conventional connector comprising an elastomeric O-ring seal may experience a failure of the elastomeric O-ring seal at pressures greater than, for example, 10,000 PSI (69 MPa). In connectors comprising a pressure compensation chamber, the elastomeric O-ring may be exposed to pressures of 10,000 PSI (69 MPa) or greater from two directions (e.g., from the external environment and internally due to the pressure compensation). Thus, the O-ring in the conventional connector may be compressed from both directions and thereby lose sealing contact with a portion of the conventional connector, which can enable seawater to enter the conventional connector and/or interfere with the electrical and/or optical signal.

In view of the aforementioned issues, the present disclosure provides a connector that can operate at a pressure of at least 10,000 PSI (69 MPa) and can inhibit fluids from entering the connector and/or the connection between connectors. The connector comprises a housing, a contact, a plunger, and a spring activated seal. The contact is positioned within the housing and configured to transmit at least one of an electrical signal and an optical signal between the connector and a secondary device. The plunger is positioned within the housing and is in communication with the contact. The spring activated seal comprises a flexible portion and a spring configured to urge the flexible portion to contact at least one of the housing and at least one of the plunger and a contact of the secondary device to form a fluid tight seal therebetween.

Figure 2A:
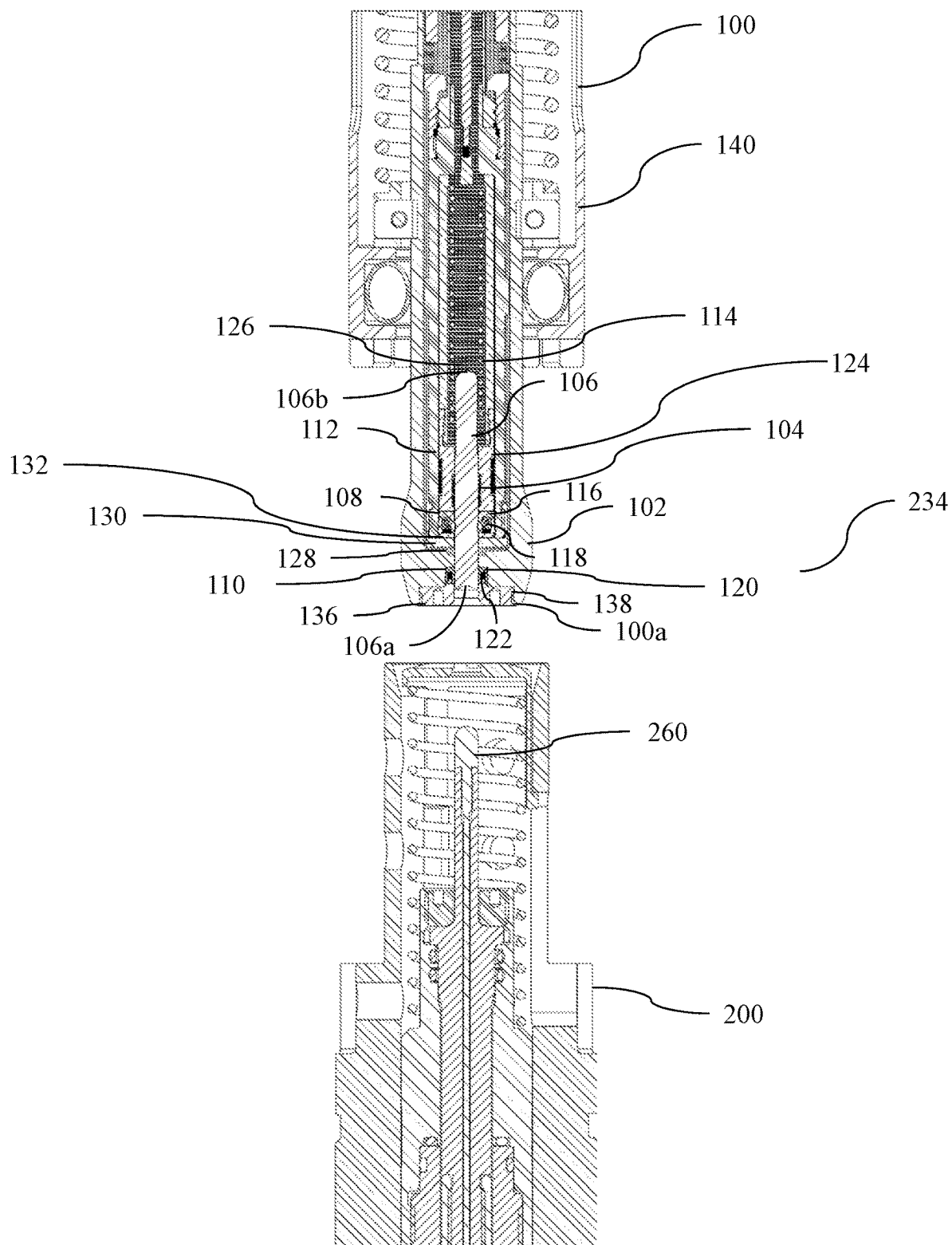
FIG. 2A is a front cross-sectional view of the connector of FIG. 1 and a secondary connector in an unengaged configuration.
Figure 2B:
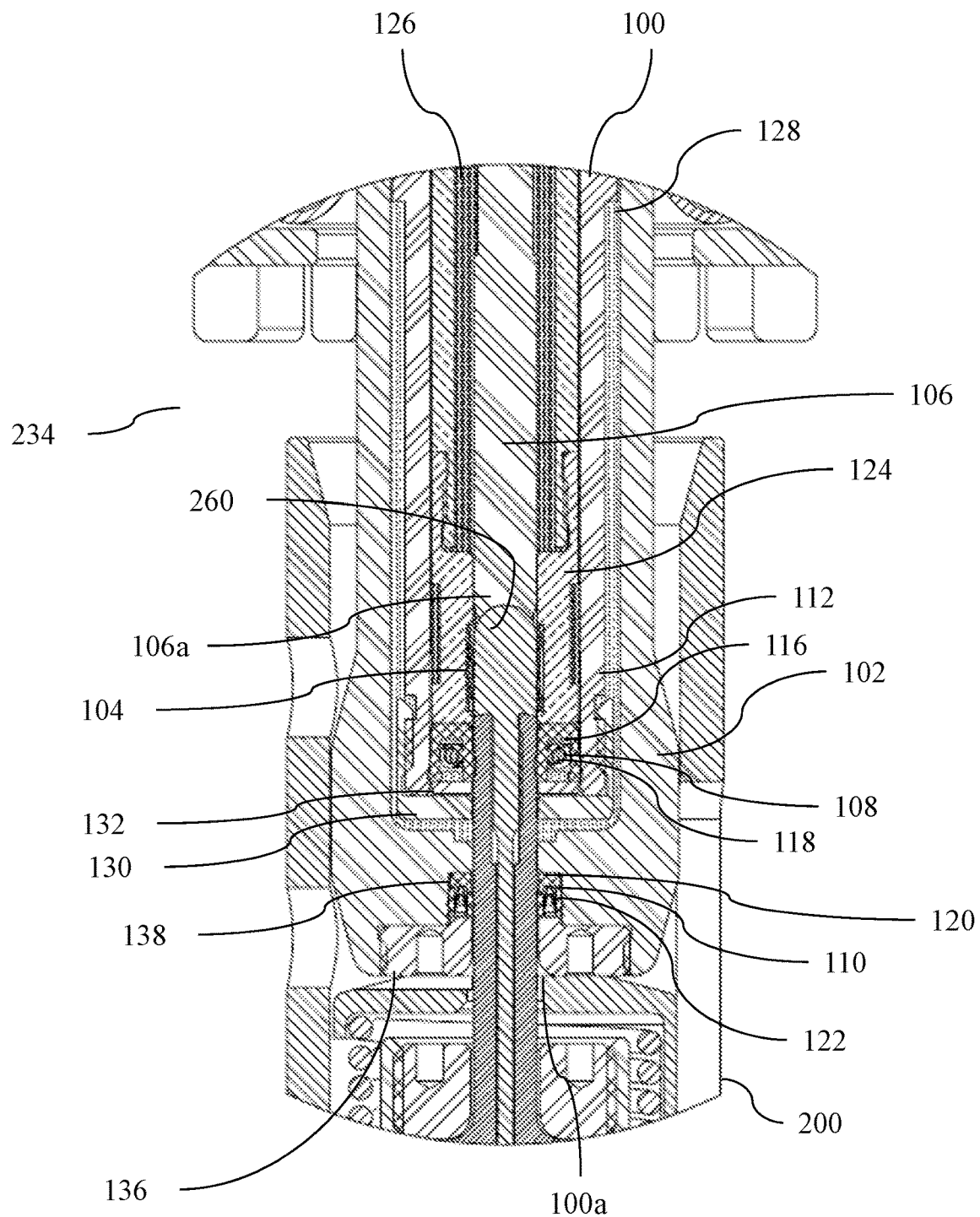
FIG. 2B is a front cross-sectional view of the connector and the secondary connector of FIG. 2B in an engaged configuration.

Referring to FIGS. 1 and 2A-B, a non-limiting embodiment of a connector 100 according to the present disclosure is provided. As illustrated, the connector 100 is a plug. It is contemplated that the teachings of the present disclosure are equally applicable to a connector in the form of a receptacle. The connector comprises a first end 100a (e.g., action end) and a second end 100b (e.g., static end). The first end 100a of the connector 100 is configured to be received by a secondary device, such as secondary device 200 illustrated in FIGS. 2A-B and described herein (e.g., a mating connector such as a receptacle).

The connector 100 can comprise a housing 102, a contact 104 (e.g., conductive element), a plunger 106, a spring activated seal 108, a spring activated seal 110, an inner housing 112, and an outer housing 140. The housing 102 can comprise a bore therethrough forming a cavity therein. The cavity of the housing 102 can be configured to receive the contact 104, plunger 106, spring activated seal 108, spring activated seal 110, and inner housing 112. The cavity of the housing 102 can be separated from the external environment by the spring activated seal 110. The cavity of the housing 102 can be filled with a dielectric fluid 128, such as, for example, silicone oil. The dielectric fluid 128 can maintain proper transmission of the electrical and/or optical signal through the connector 100.

In various non-limiting embodiments, the connector 100 can be a pressure compensated connector. For example, the connector 100 can comprise a moveable member 142, such as, for example, a piston, bellows, and/or an elastomeric wall. A first side 142a of the moveable member 142 can be in communication with the environment external to the connector 100a via ports 144. For example, in operation, the first side 142a can be in contact with seawater. A second side 142b of the moveable member 142 can be in contact with the dielectric fluid 128. The moveable member can move (e.g., inwards, outwards) responsive to a change in the surrounding pressure and/or temperature such that the pressure within the cavity of the housing 102 is substantially the same as the pressure of the external environment.

The inner housing 112 can comprise a bore therethrough forming a cavity therein. The cavity of the inner housing 112 can be separated from the dielectric fluid 128 by the spring activated seal 108. The cavity of the inner housing 112 can be configured to receive the contact 104, the plunger 106, and the spring activated seal 108. The cavity of the inner housing 112 can be filled with a dielectric fluid 126, such as, for example, silicone oil. The redundant spring activated seals, 108, 110, can ensure proper transmission of the electrical and/or optical signal through the connector 100.

The contact 104 can be positioned within the inner housing 112 proximal to the first end 100a of the connector 100. The contact 104 can be configured to transmit at least one of an electrical signal and an optical signal between the connector 100 and the secondary device 200. The contact 104 can be a springing contact and the contact 104 can be connected to a contact body 124 positioned within the inner housing 112.

The plunger 106 can be positioned within the inner housing 112 proximal to the first end 100a of the connector 100. The plunger 106 can comprise a first end 106a and a second end 106b. In the disengaged configuration of the connector 100, as illustrated in FIGS. 1 and 2A, the plunger 106 is in a first position. The first position of the plunger 106 can be maintained by a spring 114 configured to urge the plunger 106 towards the first end 100a of the connector 100, thereby contacting the spring activated seals 108, 110. The plunger 106 can be in communication with the contact 104. For example, in the first position of the plunger 106, the plunger 106 can be in contact with the contact 104.

Referring to FIGS. 2A-B, when the first end 100a of the connector 100 engages and/or mates with the secondary device 200, a contact 260 (e.g., a pin) of the secondary device 200 can urge the plunger 106 toward the second end 100b of the connector 100. For example, the contact 260 can contact the plunger 106 and overcome force applied to the plunger 106 by spring 114 in order to move the plunger 106 from the first position, as illustrated in FIGS. 1 and 2A, to a second position of the plunger 106, as illustrated in FIG. 2B. In the second position, the plunger 106 is not in contact with the spring activated seals 108, 110, and the contact 104. As illustrated in FIG. 2B, the contact 260 can be in contact with the spring activated seals 108, 110 and the contact 104, thereby establishing electrical and/or optical communication between the connector 100 and the secondary device 200.

Referring to FIGS. 2A-B, the spring activated seal 108 can be positioned within the inner housing 112 and configured to inhibit the dielectric fluid 126 from exiting the cavity of the inner housing 112. For example, the spring activated seal 108 can separate (e.g., isolate) the dielectric fluid 126 from the dielectric fluid 128 by forming a fluid tight seal between the cavity of the inner housing 112 and the cavity of the housing 102. A threaded nut 130 can be connected to the inner housing 112 and configured to retain the spring activated seal 108 within the cavity of the inner housing 112. The threaded nut 130 can be internally threaded and can engage threads (not shown) on the inner housing 112. The spring activated seal 108 can be in contact with a contact body 124 within the inner housing 112. In various non-limiting embodiments, a washer 132 can be positioned intermediate a portion of the threaded nut 130 and the spring activated seal 108. In various non-limiting embodiments, the connector 100 does not include the washer 132.

The spring activated seal 108 can comprise a flexible portion 116 and a spring 118 which can be configured to urge the flexible portion 116 to contact the inner housing 112 and the plunger 106 when the plunger 106 is in the first position, as illustrated in FIGS. 1 and 2A, to form a fluid tight seal therebetween. When the plunger 106 is in the second position, as illustrated in FIG. 2B, the spring 118 can be configured to urge the flexible portion 116 to contact the inner housing 112 and the contact 260 of the secondary device 200 to form a fluid tight seal therebetween. The fluid tight seal formed therein can inhibit the dielectric fluid 126 from exiting the cavity of the inner housing 112 and/or from intermixing with the dielectric fluid 128. As illustrated, in certain non-limiting embodiments a cross-section of the spring activated seal 108 can be generally torus shaped.

Figure 4:
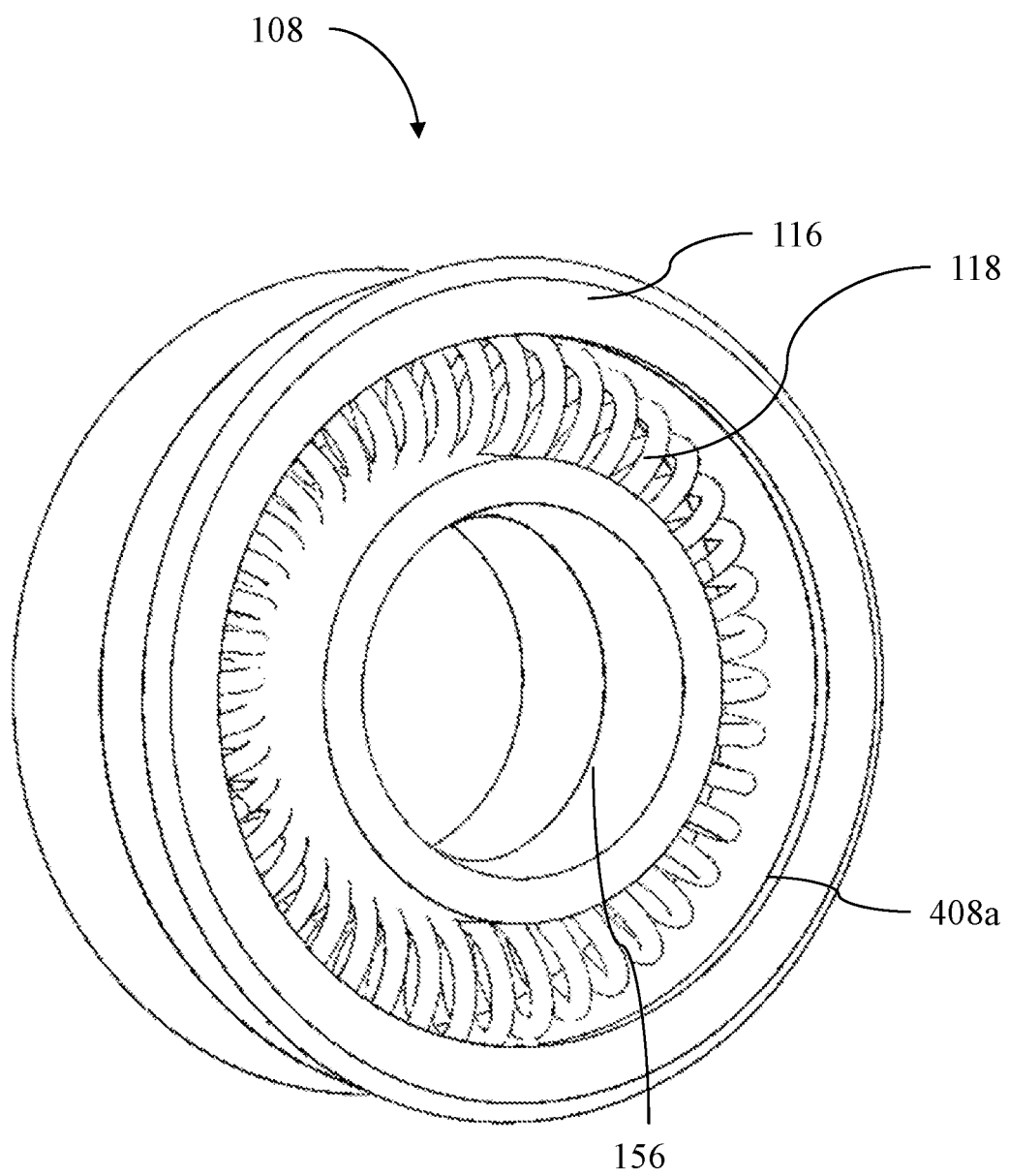
FIG. 4 is a perspective view of a non-limiting embodiment of a spring activated seal according to the present disclosure.

FIG. 4 is a perspective view of an embodiment of the spring activated seal 108. As illustrated, the spring activated seal 108 can be generally torus-shaped and can comprise a concave portion 408a configured to receive the spring 118. In various embodiments, the spring activated seal 108 also can comprise a protrusion 156 configured to contact the plunger 106 of the connector 100 and/or contact 260 of the secondary device 200 in order to scrape or otherwise remove debris from the plunger 106 and/or contact 260.

Referring yet again to FIGS. 2A-B, the spring activated seal 110 can be positioned within the housing 102 and configured to inhibit the dielectric fluid 128 from exiting the cavity the housing 102 and/or otherwise intermixing with the external environment. For example, the spring activated seal 110 can be configured to separate (e.g., isolate) the dielectric fluid 128 from an external environment outside of the connector 100 such as, for example, seawater 234. The spring activated seal 110 can be positioned within a relief portion 138 (e.g., counter-bore) of the housing 102. The spring activated seal 110 can be retained within the cavity of the housing 102 by a threaded nut 136 connected to the housing 102. The threaded nut 136 can be externally threaded and can engage threads (not shown) on the housing 102.

The spring activated seal 110 comprises a flexible portion 120 and a spring 122 which can be configured to urge the flexible portion 120 to contact the housing 102 and the plunger 106 when the plunger 106 is in the first position as illustrated in FIGS. 1 and 2A to form a fluid tight seal therebetween. When the plunger 106 is in the second position, as illustrated in FIG. 2B, the spring 122 can be configured to urge the flexible portion 120 to contact the housing 102 and the contact 260 of the secondary device 200 to form a fluid tight seal therebetween. The fluid tight seals formed therein can inhibit the dielectric fluid 128 from exiting the cavity of the housing 102 and/or otherwise intermixing with the external environment and can prevent ingress of external fluids. As illustrated, in certain embodiments a cross-section of the spring activated seal 110 can be generally V-shaped.

Figure 5:
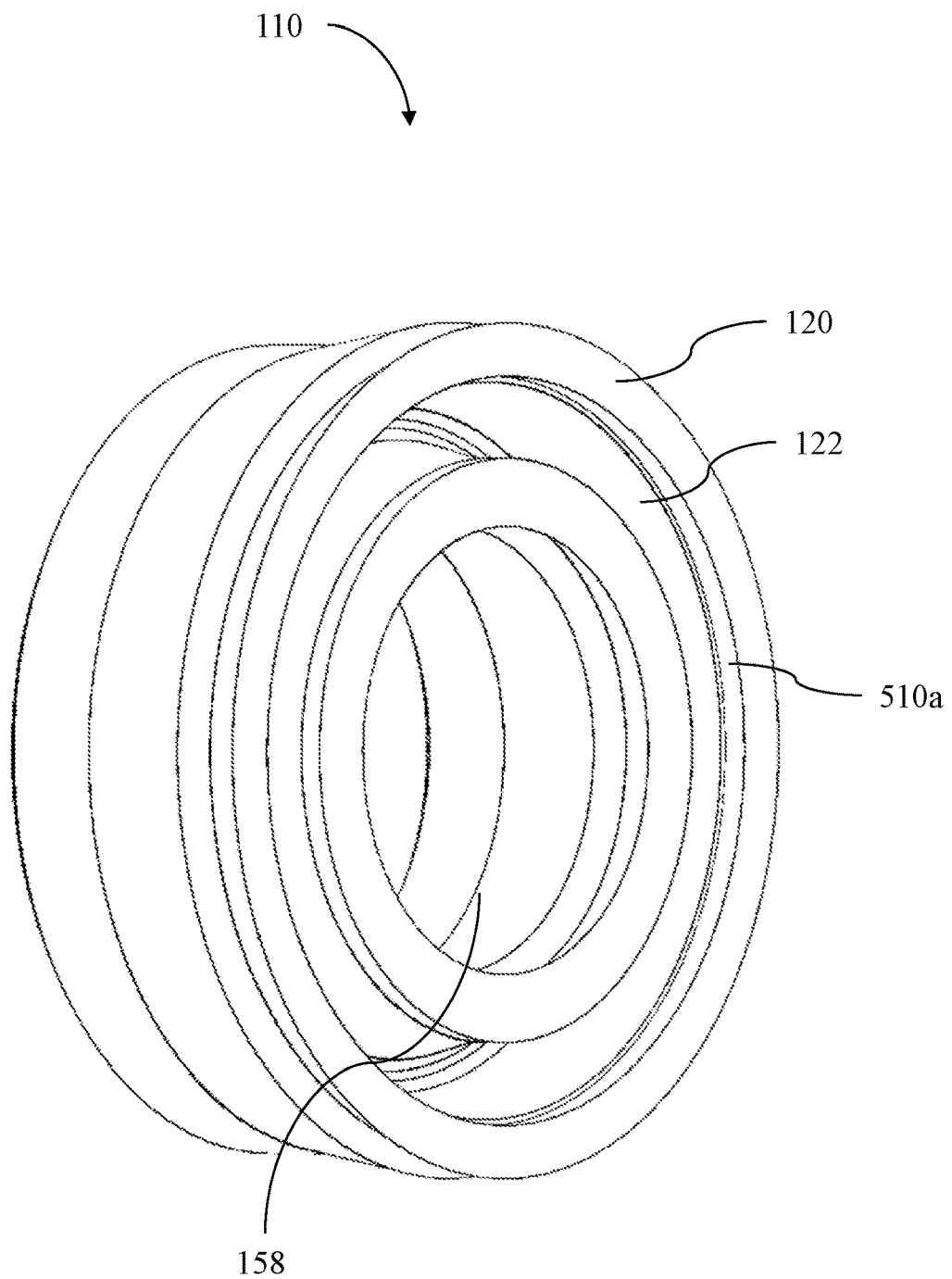
FIG. 5 is a perspective view of a non-limiting embodiment of a spring activated seal according to the present disclosure.

FIG. 5 is a perspective view of an embodiment of the spring activated seal 110. As illustrated in FIG. 5, the spring activated seal 110 can comprise a concave portion 510a configured to receive the spring 118. In various embodiments, the spring activated seal 110 can comprise a protrusion 158 configured to contact the plunger 106 and/or contact 260 of the secondary device 200 in order to scrape or otherwise remove debris from the plunger and/or contact 260.

Figure 3:
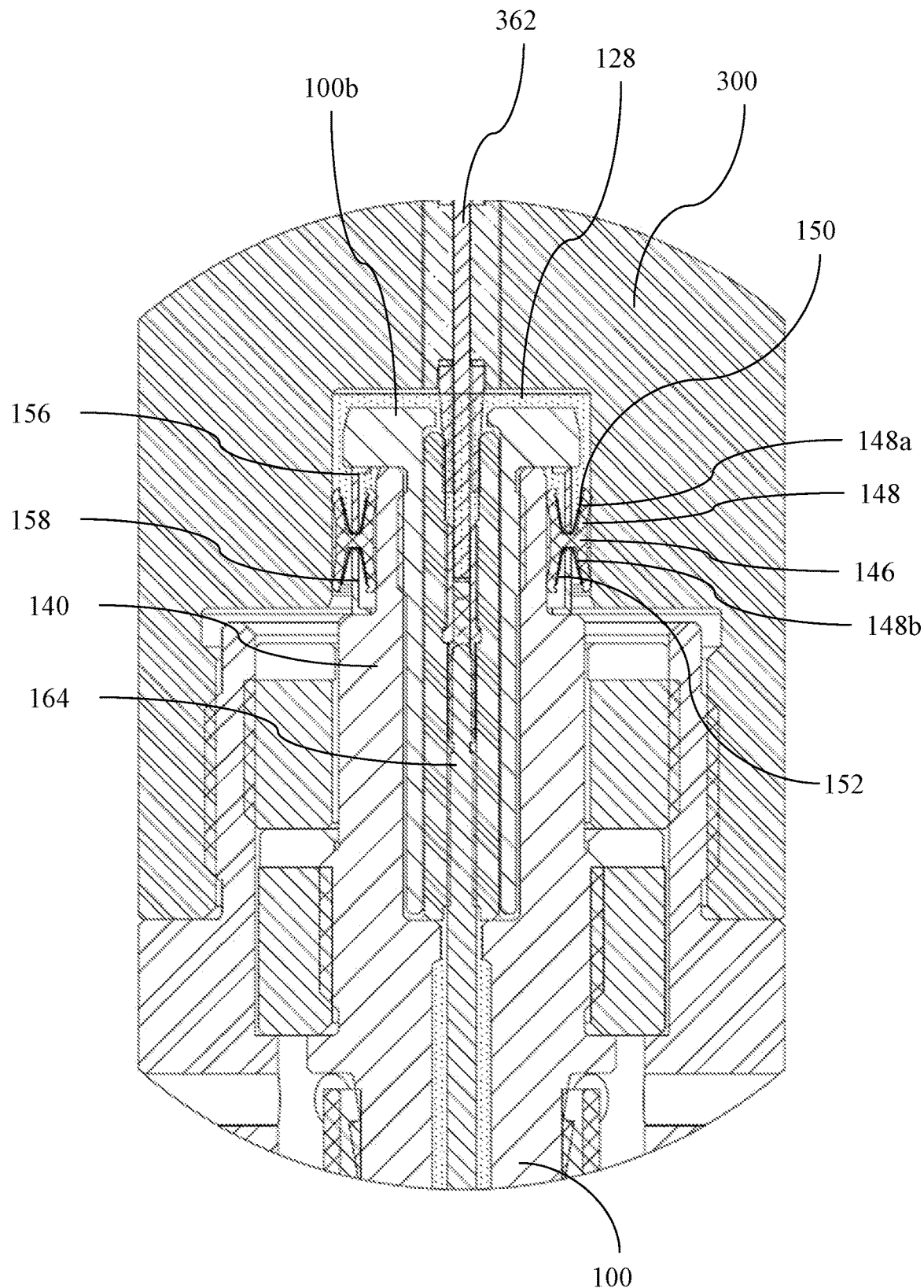
FIG. 3 is a detailed view of region A of the connector of FIG. 1.

Referring to FIGS. 1 and 3, a contact 164 can be positioned within the outer housing 140 and configured to transmit at least one of an electrical signal and an optical signal between the connector 100 and a contact 362 of a secondary device 300. The connector 100 can comprise a dual-lipped spring activated seal 146 comprising a flexible portion 148, a first spring 150, and a second spring 152. The flexible portion 148 can comprise a first concave portion 148a and a second concave portion 148b. The first spring 150 can be positioned within the first concave portion 148a and configured to urge the first concave portion 148a to contact the outer housing 140 and the secondary device 300 to form a first fluid tight seal therebetween. The second spring 152 can be configured to urge the second concave portion 148b to contact the outer housing 140 and the secondary device 300 to form a second fluid tight seal therebetween.

Figure 6:
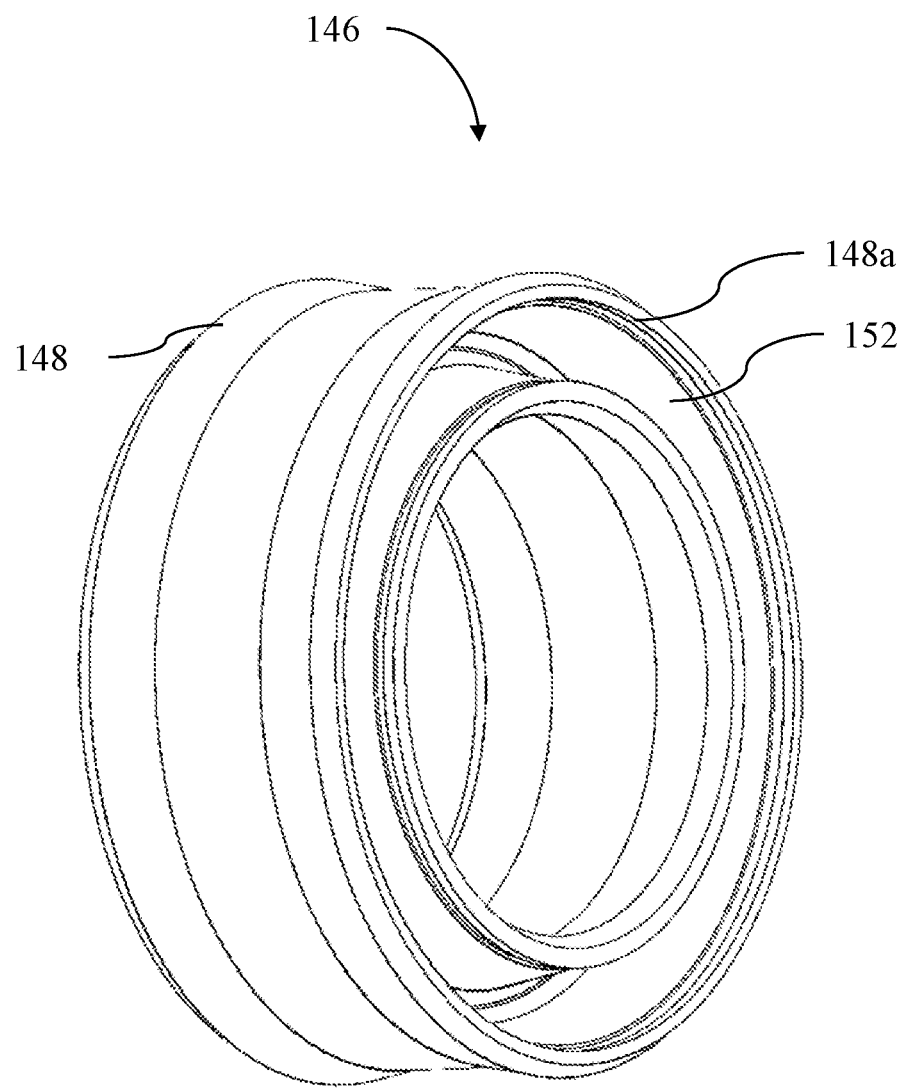
FIG. 6 is a perspective view of a non-limiting embodiment of a dual-lipped spring activated seal according to the present disclosure.

The dual-lipped spring activated seal 146 can be configured to inhibit the dielectric fluid 128 from exiting a connection cavity formed by the mating of the connector 100 and the secondary device 300 and/or otherwise mixing with the external environment. For example, the dual-lipped spring activated seal 146 can separate (e.g., isolate) the dielectric fluid 128 from the external environment outside of the connector 100 such as, for example, seawater 234. As illustrated, in certain embodiments a cross-section of the dual-lipped spring activated seal 146 can be generally X-shaped. FIG. 6 provides a perspective view of an embodiment of the dual-lipped spring activated seal 146.

Referring back to FIG. 3, a hat ring 356 and a hat ring 358 can be in contact with the dual-lipped spring activated seal 146 and the outer housing 140. The hat rings 356 and 358 can be configured to maintain a position of the dual-lipped spring activated seal 146 relative to the outer housing 140. For example, the dual-lipped spring activated seal 146 can be positioned intermediate the hat rings 356 and 358.

The flexible portions 116, 120, and 148 can each individually comprise an electrically insulative material. In various embodiments, the flexible portions 116, 120, and 148 can each individually comprise at least one of a thermoplastic material and a thermoset material. For example, the flexible portions 116, 120, and 148 can each individually comprise at least one of polytetrafluoroethylene and a polytetrafluoroethylene derivative (e.g., polytetrafluoroethylene with polyimide fill). The flexible portions 116, 120, and 148 can each individually be non-elastomeric. That is, each flexible portion 116, 120, and 148 may not comprise an elastomer, such as, for example, rubber (e.g., silicone rubber, ethylene propylene rubber, ethylene propylene diene rubber, a fluoroelastomer, a perfluoroelastomer). However, it is contemplated that in various embodiments the flexible portions 116, 120, and 148 can be coated with an elastomer.

The springs 118, 122, 150, and 152 can be of various types and configurations which are configured to form their respective fluid tight seal. For example, each spring 118, 122, 150, and 152 individually can comprise at least one of a V-shaped spring (e.g., a cantilever spring), a canted spring (e.g., a canted coil spring), and a helical spring. As illustrated in FIGS. 1-6, the springs 122, 150, and 152 are V-shaped springs and spring 118 is a canted spring.

The connector 100 can be configured to operate at a pressure of at least 10,000 PSI (69 MPa), such as, for example, at least 15,000 PSI (103 MPa), at least 18,000 PSI (124 MPa), at least 20,000 PSI (138 MPa), at least 25,000 PSI (172 MPa), or at least 30,000 PSI (207 MPa).

The connector 100 can be configured to operate with in various ranges of temperature such as, for example, at least as low as −300 degrees Fahrenheit (−184 degrees Celsius), as low as −200 degrees Fahrenheit (−129 degrees Celsius), as low as −100 degrees Fahrenheit (−73 degrees Celsius), as low as 0 degrees Fahrenheit (−18 degrees Celsius), up to 100 degrees Fahrenheit (38 degrees Celsius), up to 200 degrees Fahrenheit (93 degrees Celsius), up to 250 degrees Fahrenheit (121 degrees Celsius), up to 300 degrees Fahrenheit (149 degrees Celsius), up to 350 degrees Fahrenheit (177 degrees Celsius), up to 400 degrees Fahrenheit (204 degrees Celsius), up to 450 degrees Fahrenheit (232 degrees Celsius), or up to 500 degrees Fahrenheit (260 degrees Celsius). For example, the connector 100 can be configured to operate with a temperature range of −400 degrees Fahrenheit (−184 degrees Celsius) to 500 degrees Fahrenheit (260 degrees Celsius), such as, for example, −100 degrees Fahrenheit (−73 degrees Celsius) to 500 degrees Fahrenheit (260 degrees Celsius), or 0 degrees Fahrenheit (−18 degrees Celsius) to 400 degrees Fahrenheit (204 degrees Celsius).

With reference to the non-limiting embodiment shown in FIGS. 1 and 2A-B, the connector 100 can be applied as a portion of a single pin, wet-mateable electrical connector or feedthrough, such as the Electrical Feedthrough System for subsea wellhead completions manufactured by Teledyne DGO (a business unit of Teledyne Technologies Incorporated), Portsmouth, N.H., USA. However, it will be understood that other wellhead plugs or connectors including a pin or multiple pins may be adapted to include similar spring activated seals.

The connector according to the present disclosure can be configured to undergo pressure and/or temperature cycling (e.g., 30 cycles or greater at 22,500 PSI (155 MPa), −40 degrees Fahrenheit (−40 degrees Celsius) to 35 degrees Fahrenheit (1.7 degrees Celsius), 158 degrees Fahrenheit (70 degrees Celsius) to 35 degrees Fahrenheit (1.7 degrees Celsius), 50 degrees Fahrenheit (10 degrees Celsius) and 0 PSI (0 MPa) to 302 degrees Fahrenheit (150 degrees Celsius) and 20,000 PSI (138 MPa)), turbid liquid mating (at least 50 mates in a sand and silt environment), shock/vibrations (e.g., sweep and random vibration), and pressurized mating (at least 50 mates at 20,000 PSI (138 MPa)) while maintaining optimal electrical and/or optical signal transmission. The configuration of the connector according to the present disclosure can enable a longer operational life, a higher operational pressure range, and/or a larger operational temperature range than convention connectors.

Various non-limiting aspects of the invention include, but are not limited to, the aspects listed in the following numbered clauses.

1. A connector comprising: a housing; a contact positioned within the housing and configured to transmit at least one of an electrical signal and an optical signal between the connector and a secondary device; a plunger positioned within the housing and in communication with the contact; and a first spring activated seal comprising: a first flexible portion; and a first spring configured to urge the first flexible portion to contact the housing and at least one of the plunger and a contact of the secondary device to form a fluid tight seal therebetween.
2. The connector of clause 1, wherein the first flexible portion comprises an electrically insulative material.
3. The connector of any one of clauses 1-2, wherein the first flexible portion comprises at least one of a thermoplastic material and a thermoset material.

4. The connector of any one of clauses 1-3, wherein the first flexible portion comprises at least one of polytetrafluoroethylene and a polytetrafluoroethylene derivative.

5. The connector of any one of clauses 1-4, wherein the first flexible portion is non-elastomeric.

6. The connector of any one of clause 1-5, wherein the first spring is at least one of a V-shaped spring, a canted spring, and a helical spring.

7. The connector of any one of clause 1-6, further comprising a threaded nut configured to retain the spring activated seal within the housing.

8. The connector of clause 7, further comprising a washer intermediate the threaded nut and the spring activated seal.

9. The connector of any one of clauses 1-8, further comprising a dielectric fluid within a cavity of the housing, wherein the fluid tight seal inhibits the dielectric fluid from exiting the cavity.

10. The connector of any one of clauses 1-9, further comprising a second spring activated seal comprising: a second flexible portion; and a second spring configured to urge the second flexible portion to contact the housing and at least one of the plunger and the contact of the secondary device to form a second fluid tight seal therebetween.

11. The connector of clause 10, wherein the first spring is a V-shaped spring and the second spring is a canted spring.

12. The connector of any one of clauses 10-11, further comprising a first dielectric fluid within a first cavity of the housing, and a second dielectric fluid within a second cavity of the contact, wherein the first dielectric fluid is separated from the second dielectric fluid by the second fluid tight seal, and wherein the first dielectric fluid is separated from an external environment by the first fluid tight seal.

13. The connector of any one of clauses 1-12, wherein the connector is configured to operate at a pressure of at least 10,000 pounds per square inch and at a temperature of at least 250 degrees Fahrenheit.

14. A connector comprising: a housing; a contact positioned within the housing and configured to transmit at least one of an electrical signal and an optical signal between the connector and a secondary device; and a dual-lipped spring activated seal comprising: a flexible portion comprising a first concave portion and a second concave portion; a first spring configured to urge the first concave portion to contact the housing and the secondary device to form a first fluid tight seal therebetween; and a second spring configured to urge the second concave portion to contact the housing and the secondary device to form a second fluid tight seal therebetween.

15. The connector of clause 14, wherein the flexible portion comprises an insulative material.

16. The connector of any one of clauses 14-15, wherein the flexible portion comprises at least one of a thermoplastic material and a thermoset material.

17. The connector of any one of clauses 14-16, wherein the flexible portion comprises polytetrafluoroethylene or a polytetrafluoroethylene derivative.

18. The connector of any one of clauses 14-17, wherein the flexible portion is non-elastomeric.

19. The connector of any one of clauses 14-18, wherein the first spring and the second springs individually comprise at least one of a V-shaped spring, a canted spring, and a helical spring.

20. The connector of any one of clauses 14-19, wherein the connector is configured to operate at a pressure of at least 10,000 pounds per square inch and at a temperature of at least 250 degrees Fahrenheit.

21. The connector of any one of clauses 14-20, further comprising a hat ring in contact with the dual-lipped spring activated seal and the body, the hat ring configured to maintain a position of the dual-lipped spring activated seal relative to the body.

One skilled in the art will recognize that the herein described fasteners, structures, operations/actions, and objects, and the discussion accompanying them, are used as examples for the sake of conceptual clarity and that various configuration modifications are contemplated. Consequently, as used herein, the specific examples/embodiments set forth and the accompanying discussion are intended to be representative of their more general classes. In general, use of any specific exemplar is intended to be representative of its class, and the non-inclusion of specific components, devices, apparatus, operations/actions, and objects should not be taken as limiting. While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

What is claimed is:

1. A connector comprising:
a housing;
a contact positioned within the housing and configured to transmit at least one of an electrical signal and an optical signal between the connector and a secondary device; and
a dual-lipped spring activated seal comprising:
a flexible portion comprising a first concave portion and a second concave portion;
a first spring configured to urge the first concave portion to contact the housing and the secondary device to form a first fluid tight seal therebetween; and
a second spring configured to urge the second concave portion to contact the housing and the secondary device to form a second fluid tight seal therebetween.

2. The connector of claim 1, wherein the flexible portion comprises an insulative material.

3. The connector of claim 1, wherein the flexible portion comprises at least one of a thermoplastic material and a thermoset material.

4. The connector of claim 1, wherein the flexible portion comprises polytetrafluoroethylene or a polytetrafluoroethylene derivative.

5. The connector of claim 1, wherein the flexible portion is non-elastomeric.

6. The connector of claim 1, wherein the first spring and the second springs individually comprise at least one of a V-shaped spring, a canted spring, and a helical spring.

7. The connector of claim 1, wherein the connector is configured to operate at a pressure of at least 10,000 pounds per square inch and at a temperature of at least 250 degrees Fahrenheit.

8. The connector of claim 1, further comprising a hat ring in contact with the dual-lipped spring activated seal and the body, the hat ring configured to maintain a position of the dual-lipped spring activated seal relative to the body.

* * * * *